United States Patent
Makino

(10) Patent No.: US 11,128,018 B2
(45) Date of Patent: Sep. 21, 2021

(54) CIRCUIT BODY AND BATTERY MODULE

(71) Applicant: YAZAKI CORPORATION, Tokyo (JP)

(72) Inventor: Kimitoshi Makino, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 226 days.

(21) Appl. No.: 16/506,617

(22) Filed: Jul. 9, 2019

(65) Prior Publication Data

US 2020/0020919 A1 Jan. 16, 2020

(30) Foreign Application Priority Data

Jul. 13, 2018 (JP) .............................. JP2018-133502

(51) Int. Cl.

| | |
|---|---|
| *H01M 50/502* | (2021.01) |
| *H01M 10/42* | (2006.01) |
| *H01M 10/48* | (2006.01) |
| *H05K 1/02* | (2006.01) |
| *H05K 1/11* | (2006.01) |
| *H05K 3/36* | (2006.01) |
| *H01M 50/20* | (2021.01) |
| *H01M 50/569* | (2021.01) |

(52) U.S. Cl.
CPC ........ *H01M 50/502* (2021.01); *H01M 10/425* (2013.01); *H01M 10/482* (2013.01); *H01M 50/20* (2021.01); *H01M 50/569* (2021.01); *H05K 1/028* (2013.01); *H05K 1/118* (2013.01); *H05K 3/361* (2013.01)

(58) Field of Classification Search
CPC .. H01M 50/502; H01M 50/20; H01M 10/425; H01M 10/482; H01M 50/569; H05K 1/028; H05K 1/118; H05K 3/361
See application file for complete search history.

(56) References Cited

U.S. PATENT DOCUMENTS

| | | | |
|---|---|---|---|
| 10,601,017 B2 * | 3/2020 | Ota .................... | H01M 50/20 |
| 2012/0019061 A1 | 1/2012 | Nishihara et al. | |
| 2012/0328920 A1 | 12/2012 | Takase et al. | |
| 2017/0025661 A1 * | 1/2017 | Gibeau ................ | H01R 12/67 |
| 2017/0133724 A1 * | 5/2017 | Schuetz .............. | H01M 50/20 |
| 2017/0318663 A1 | 11/2017 | Kondo et al. | |

FOREIGN PATENT DOCUMENTS

| | | |
|---|---|---|
| CN | 204809296 U | 11/2015 |
| JP | 2002-298958 A | 10/2002 |
| JP | 2003-323923 A | 11/2003 |
| JP | 2011-210711 A | 10/2011 |
| JP | 2012-226969 A | 11/2012 |
| JP | 2017-199804 A | 11/2017 |

* cited by examiner

*Primary Examiner* — Matthew J Merkling
(74) *Attorney, Agent, or Firm* — Kenealy Vaidya LLP

(57) ABSTRACT

A circuit body includes: a plurality of conductors, and first and second substrates, wherein the first and second substrates include a battery wiring portion which is routed along each row of an electrodes and one ends of the conductors are respectively connected to bus bars, and a connector connection portion where the other ends of the plurality of conductors are connected to a connector, and parts of the first substrate and the second substrate are overlapped in the connector connection portion, so an arrangement order of the other ends of the conductors corresponds to the potential order of the bus bars.

2 Claims, 10 Drawing Sheets

CIRCUIT BODY AND BATTERY MODULE

CROSS REFERENCE TO RELATED APPLICATIONS

This application is based on and claims priority from Japanese patent application No. 2018-133502 filed on Jul. 13, 2018, the entire contents of which are incorporated herein by reference.

BACKGROUND OF THE INVENTION

1. Technical Field

The present invention relates to a circuit body and a battery module.

2. Background Art

A battery module including a bus bar fixed to an electrode of each battery cell, a voltage detection line extending from the bus bar, and a connector for connecting the voltage detection line to an ECU is attached to a battery mounted in a hybrid car or an electric car. The ECU monitors the voltage of each battery cell detected through the voltage detection line of the battery module and adjusts the charge amount of the battery cell and the like. In those battery modules, there is one using a printed circuit body having a voltage detection line made of a conductor pattern in order to improve complicated wiring work of the voltage detection line to the battery (see JP-A-2017-199804).

SUMMARY

In a battery in which battery cells in each of which a positive electrode and a negative electrode are separated are connected in series, bus bars fixed to connection points are arranged at alternately separated positions. In a battery in which battery cells are connected in series, the voltage of the bus bars increases in order from one side of a circuit. Therefore, voltage detection lines extending from the bus bars to a connector are not arranged in the voltage order, which causes a circuit to be complicated by providing a circuit or the like which rearranges the voltage detection lines in the voltage order on an ECU side.

The invention is made in view of the circumstances described above and an object thereof is to provide a circuit body and a battery module capable of arranging voltage detection lines in the voltage order to simplify a circuit.

To attain the above object, the invention provides a circuit body and a battery module having features that are described below in the form of configurations (1) to (4):
(1) A circuit body which is assembled to a battery assembly in which electrodes of a plurality of battery cells are arranged in two rows and two or more electrodes adjacent to each other in each row are connected by a conductive member, comprising:
 a plurality of conductors and a substrate which has flexibility and is provided with the plurality of conductors, and wherein
  the substrate includes
  a battery wiring portion which is routed along each row of the electrodes and where one ends of the plurality of conductors are respectively connected to the conductive members, and
  a connector connection portion where the other ends of the plurality of conductors are connected to a connector, and
 a part of the substrate is overlapped in the connector connection portion, so an arrangement order of the other ends of the conductors corresponds to the potential order of the conductive members connected to the conductors.
(2) The circuit body according to above (1), wherein
  the substrate includes:
  a first substrate routed along one row of the electrodes; and
  a second substrate routed along the other row of the electrodes, and
  a part of the second substrate is folded in the connector connection portion and overlapped on the first substrate, so an arrangement order of the other ends of the conductors included in the first substrate and the second substrate corresponds to the potential order of the conductive members connected to the conductors.
(3) The circuit body according to above (1), wherein
  the substrate includes a base portion and a folded portion folded with respect to the base portion, and
  the folded portion is folded in the connector connection portion and overlapped on the base portion, so an arrangement order of the other ends of the conductors included in the base portion and the folded portion corresponds to the potential order of the conductive members connected to the conductors.
(4) A battery module, comprising:
  the circuit body according to above (1);
  a conductive member connected to one end of a conductor constituting the circuit body; and
  a connector connected to the other end of the conductor.

According to the circuit body configured as (1) described above, a part of the substrate is overlapped in the connector connection portion and the other ends of the conductors of which one ends are connected to respective bus bars are arranged in the connector connection portion in the potential order of the bus bars, that is, the voltage order of the battery assembly. Therefore, in the connector attached to the connector connection portion, the terminals are arranged in the voltage order of the battery assembly. As a result, when connecting the connector to an ECU which monitors the voltage of the battery cell and adjusts the charge amount or the like, it is not necessary to provide a circuit or the like that rearranges the voltage detection lines in the voltage order on the ECU side, and thus the circuit can be simplified. Also, regardless of a distance between a positive electrode and a negative electrode of the battery cell, the width of the connector connection portion can be adapted to the width of the connector.

According to the circuit body configured as (2a) described above, by folding a part of the second substrate and overlapping it on the first substrate, in the connector connection portion, the other ends of the conductors, one ends of which are connected to respective bus bars, can be arranged in the voltage order of the battery assembly. In other words, with a simplified structure, it is possible to arrange the conductors in the voltage order in the connector connection portion.

According to the circuit body configured as (3) described above, it is possible to arrange the other ends of the conductors, one ends of which are connected to respective bus bars, in the voltage order of the battery assembly, by folding the folded portion of the substrate and overlapping it on the base portion.

According to the battery module configured as (4) described above, in the connector attached to the connector connection portion, terminals thereof are arranged in the voltage order of the battery assembly. Therefore, when connecting the connector to the ECU which monitors the voltage of the battery cell and adjusts the charge amount or the like, it is not necessary to provide a circuit or the like that rearranges the voltage detection lines in the voltage order on the ECU side, and thus the circuit can be simplified.

According to the invention, it is possible to provide a circuit body and a battery module capable of arranging voltage detection lines in the voltage order to simplify a circuit.

Hereinbefore, the invention is briefly described. Furthermore, the details of the invention will be further clarified by reading the modes for carrying out the invention described below (hereinafter referred to as "embodiments") with reference to the accompanying drawings.

BRIEF DESCRIPTION OF THE DRAWINGS

FIGS. 5A to 5C are plan views of the first substrate and the second substrate, respectively;

FIGS. 10A and 10B are plan views of the substrate, respectively.

DETAILED DESCRIPTION OF EMBODIMENTS

Hereinafter specific embodiments of the invention will be described with reference to the drawings.

First Embodiment

First, a battery module according to a first embodiment will be described.

Figure 1:
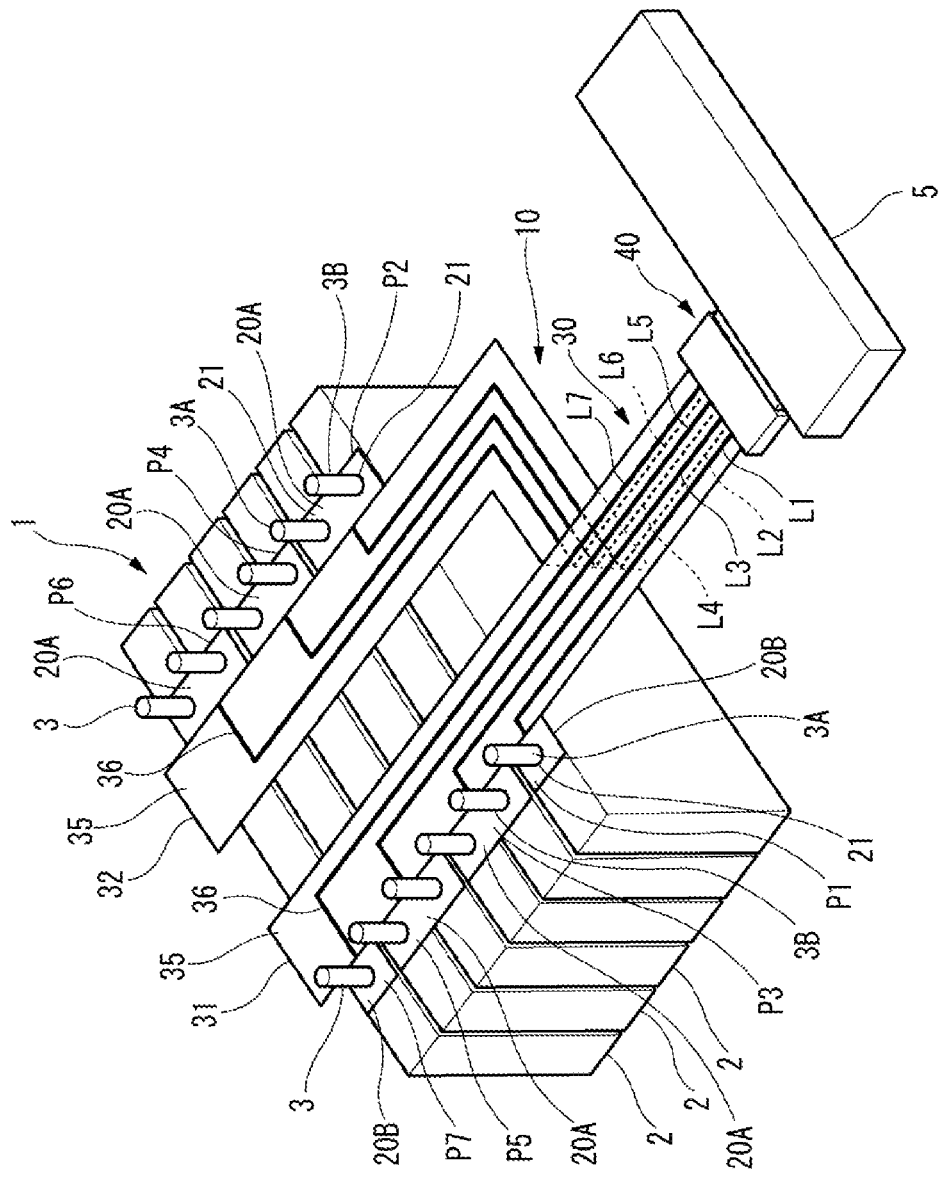
FIG. 1 is a perspective view of a battery assembly in which a battery module according to a first embodiment is assembled.
Figure 2:
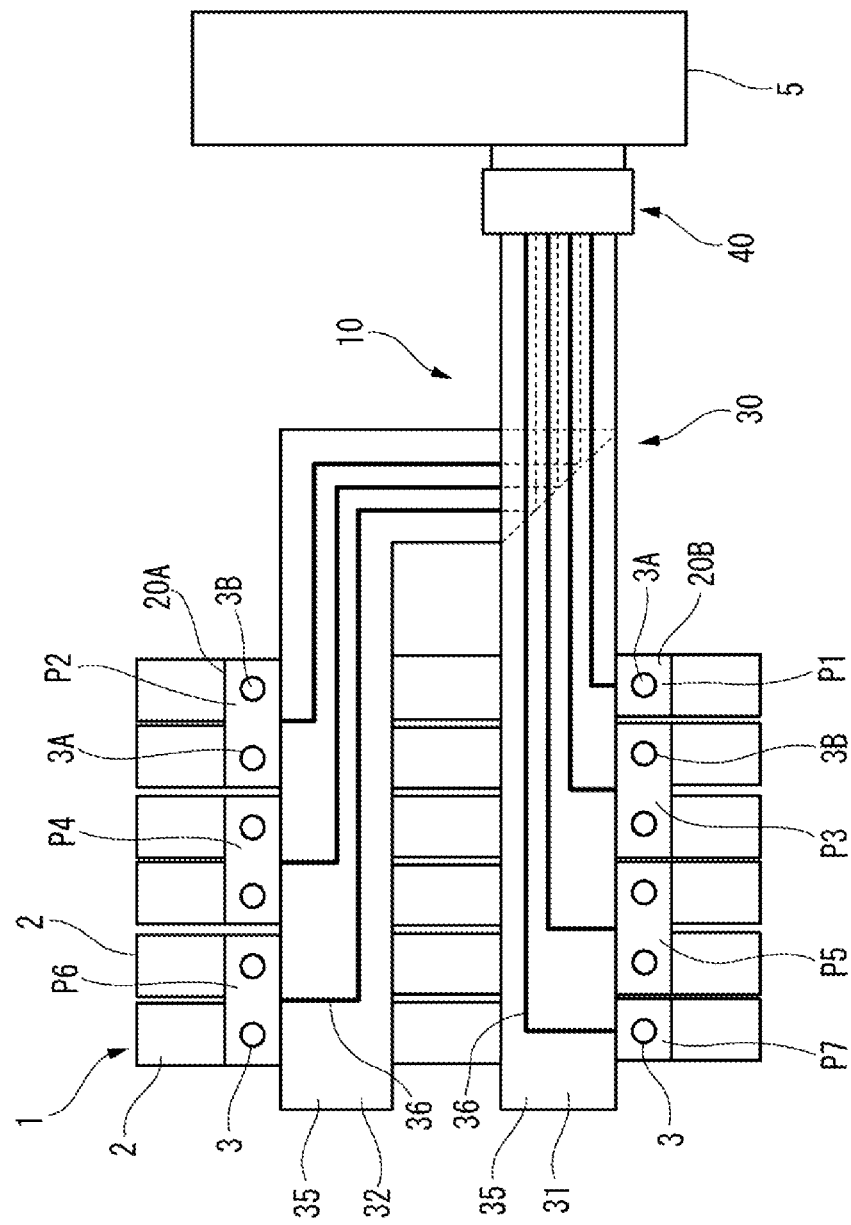
FIG. 2 is a plan view of the battery assembly in which the battery module according to the first embodiment is assembled.

FIG. 1 is a perspective view of a battery assembly in which the battery module according to the first embodiment is assembled. FIG. 2 is a plan view of the battery assembly in which the battery module according to the first embodiment is assembled.

As illustrated in FIGS. 1 and 2, a battery module 10 according to the first embodiment is assembled to a battery assembly 1. The battery assembly 1 is used, for example, as a power source of an electric car, a hybrid car, or the like. The battery assembly 1 is constituted of battery cells 2 composed of a plurality of secondary batteries.

The battery cells 2 are stacked on one another to constitute a battery assembly 1. Each battery cell 2 has a pair of electrodes 3 at the top. One of the pair of electrodes 3 is a positive electrode 3A and the other is a negative electrode 3B. The positive electrode 3A and the negative electrode 3B are disposed at mutually separated positions in each of the battery cells 2. The battery cells 2 are arranged alternately such that the positive electrode 3A and the negative electrode 3B are adjacent to each other, that is, the positive electrode side and the negative electrode side of the adjacent battery cells 2 are in the opposite direction. The battery module 10 is assembled between the arrays of electrodes 3 at the top of the battery assembly 1.

The battery module 10 includes bus bars 20A and 20B, a circuit body 30, and a connector 40.

The bus bars 20A and 20B are formed by pressing a plate made of a conductive metal material such as copper or copper alloy into a rectangular shape and each bus bar has a terminal insertion hole 21. Further, the bus bars 20A and 20B are not limited to copper or copper alloy as long as they are conductive metal materials and may be made of, for example, aluminum or aluminum alloy. The bus bar 20A has two terminal insertion holes 21 through which the positive electrode 3A and the negative electrode 3B are inserted and the bus bar 20B has one terminal insertion hole 21 through which the positive electrode 3A or the negative electrode 3B is inserted.

In the bus bar 20A, the adjacent positive electrode 3A and negative electrode 3B of two battery cells 2 are inserted into the terminal insertion holes 21. Further, the bus bar 20A is fastened to the positive electrode 3A and the negative electrode 3B by nuts (not illustrated) screwed into the positive electrode 3A and the negative electrode 3B. As a result, the adjacent positive electrode 3A and negative electrode 3B of two battery cells 2 are conducted by the bus bar 20A. In the bus bars 20B, the positive electrode 3A and the negative electrode 3B of two battery cells 2 disposed at end portions are inserted into the terminal insertion holes 21. Further, the bus bar 20B is fastened to the positive electrode 3A or the negative electrode 3B by a nut (not illustrated) screwed into the positive electrode 3A or the negative electrode 3B. In the battery assembly 1, the battery cells 2 are connected in series by the bus bars 20A and portions to which the bus bars 20A and 20B are fastened are taken as detection points P1 to P7 in order from the low potential side as points for detecting a voltage.

Figure 3:
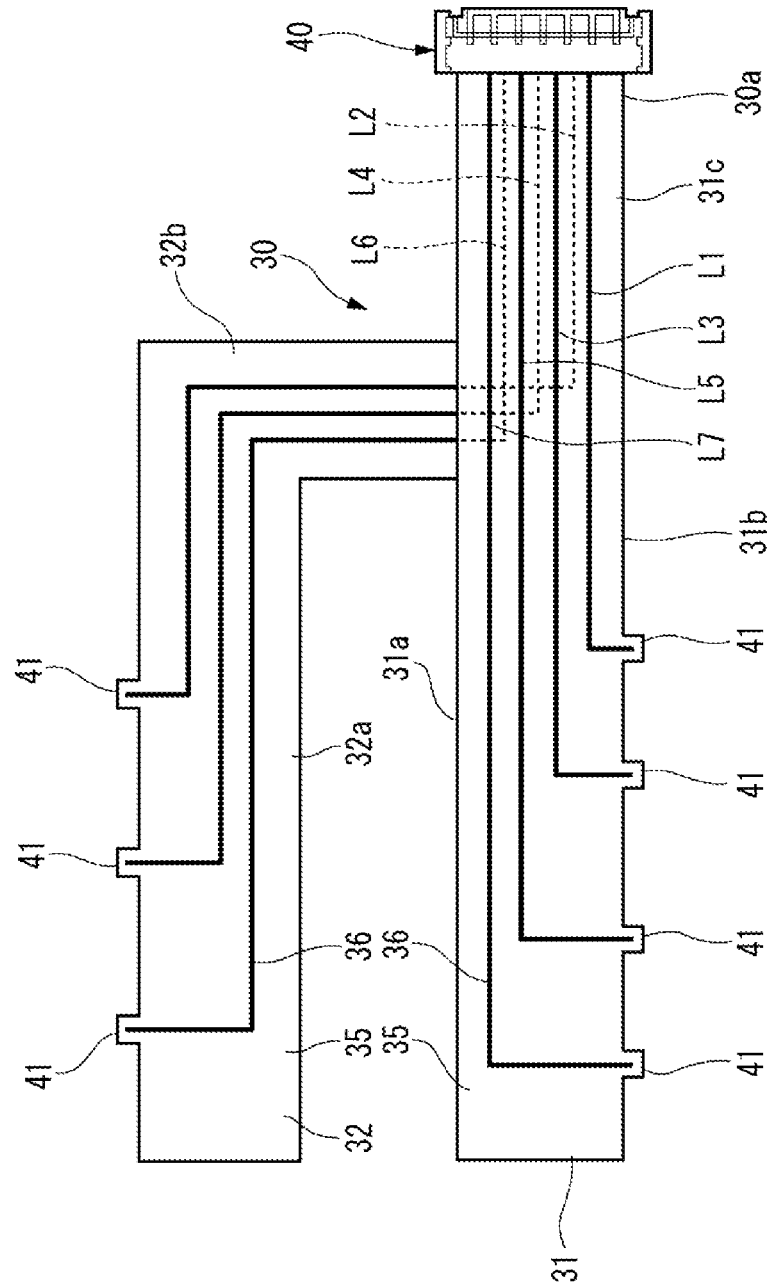
FIG. 3 is a plan view of a circuit body and a connector of the battery module.
Figure 4:
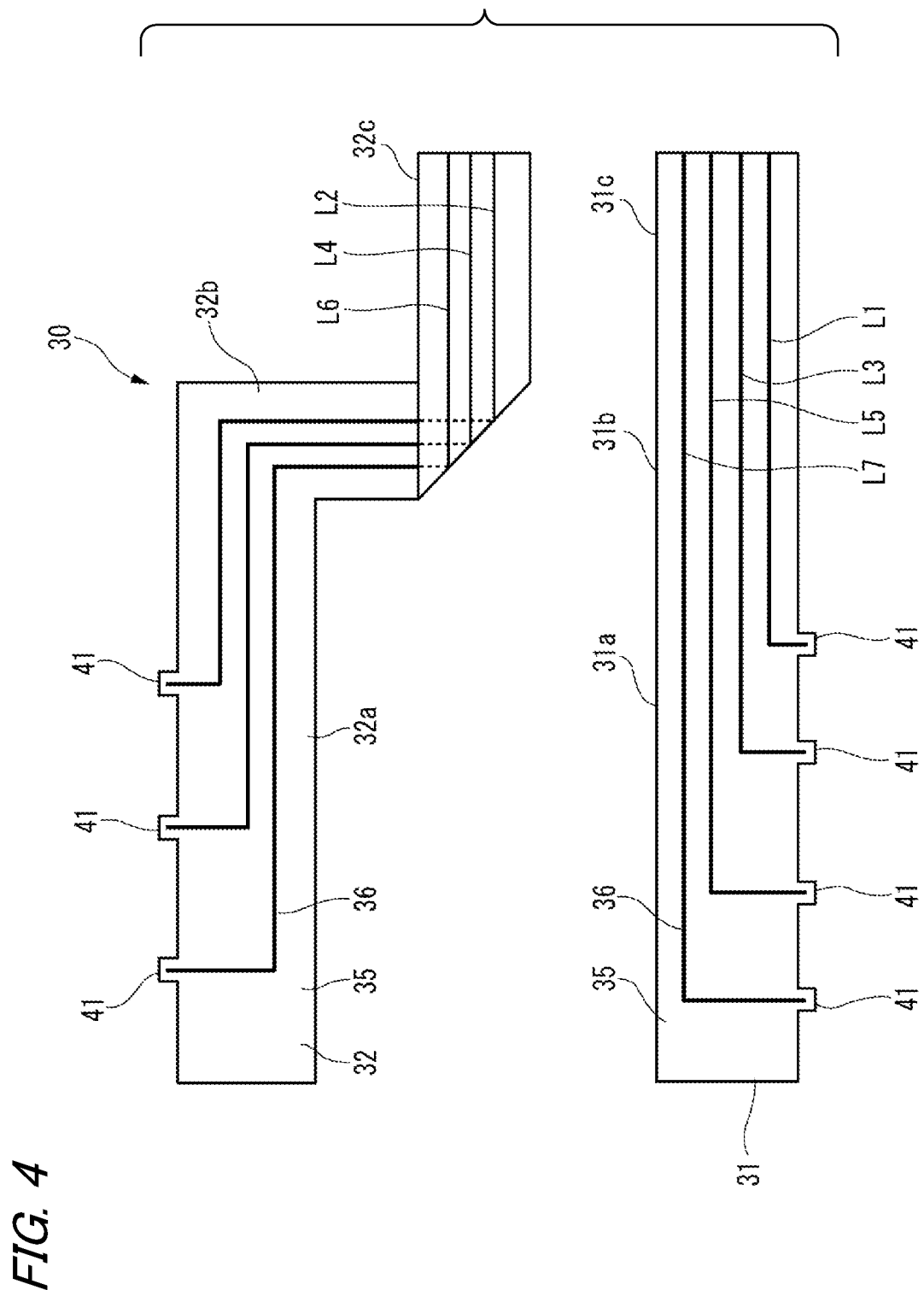
FIG. 4 is a plan view of a first substrate and a second substrate constituting the circuit body.

FIG. 3 is a plan view of the circuit body and the connector of the battery module. FIG. 4 is a plan view of a first substrate and a second substrate constituting the circuit body.

As illustrated in FIGS. 3 and 4, the circuit body 30 is constituted of a first substrate 31 and a second substrate 32. The first substrate 31 and the second substrate 32 are flexible printed circuits (FPCs) each having a base 35 and a conductor 36. The substrate 35 is constituted of a pair of flexible films bonded to each other and the conductor 36 made of a conductive metal foil is provided between the films.

The first substrate 31 and the second substrate 32 have battery wiring portions 31a and 32a, connection portions 31b and 32b, and connector connection portions 31c and 32c. In the first substrate 31 and the second substrate 32, the battery wiring portions 31a and 32a are respectively routed along two rows of the arrays of the electrodes 3 at the top of the battery assembly 1.

The battery wiring portions 31a and 32a of the first substrate 31 and the second substrate 32 have connection port portions 41 protruding from edge portions and one end of the conductors 36 is drawn into each connection port portion 41. In those connection port portions 41, there is no film on the upper side of the base 35 and one end of the conductor 36 is exposed on an upper surface. The bus bars 20A and 20B are overlapped and joined to the upper portions of those connection port portions 41. Thus, the bus bars 20A and 20B and the conductor 36 are electrically connected. As a method of joining the bus bars 20A and 20B in the connection port portion 41, for example, welding, caulking, fastening with a screw or the like may be used. Further, as the connection port portion 41, one end of the conductor 36 may be exposed on a lower surface. In this case, the bus bars 20A and 20B are overlapped and joined to a lower portion of the connection port portion 41.

In the first substrate 31, the battery wiring portion 31a, the connection portion 31b, and the connector connection portion 31c are provided along the same direction. The conductors 36 of the first substrate 31 are voltage detection lines L1, L3, L5, and L7 connected to the detection points P1, P3, P5, and P7.

In the second substrate 32, the connection portion 32b extends perpendicular to battery wiring portion 32a and toward the first substrate 31 and the connector connection portion 32c extends perpendicular to the connection portion 32b and parallel to an extending direction of the first substrate 31. The conductors 36 of the second substrate 32 are voltage detection lines L2, L4, and L6 connected to the detection points P2, P4, and P6.

In the first substrate 31 and the second substrate 32, the respective connector connection portions 31c and 32c are overlapped on each other. Further, portions where the connector connection portions 31c and 32c are overlapped are set as a connector connection end 30a in the circuit body 30. By overlapping the connector connection portions 31c and 32c, in terms of the conductors 36, the voltage detection lines L2, L4, and L6 of the second substrate 32 are arranged between the voltage detection lines L1, L3, L5, and L7 of the first substrate 31. Thus, in the connector connection end 30a of the circuit body 30, the conductors 36 are arranged in the order of voltage detection lines L1 to L7 from one side. That is, in the connector connection end 30a, the conductors 36 are arranged in the arrangement order of the battery cells 2 to be connected, that is, the order of voltage.

The connector 40 is connected to the connector connection end 30a of the circuit body 30. The connector 40 is connected to an Electronic Control Unit (ECU) 5 (see FIGS. 1 and 2). Therefore, the voltage values of the voltage detection lines L1 to L7 of the circuit body 30 can be detected by the ECU 5.

In the connector 40, for example, seven terminals (not illustrated) having press-contacting blades such as tuning fork-like terminals are provided at the top and bottom and those terminals are electrically connected to the conductors 36 of the voltage detection lines L1 to L7 by biting into the first substrate 31 and the second substrate 32. Specifically, in the connector 40, four terminals provided on an upper side bite into the first substrate 31 from the upper surface and are electrically connected to the conductors 36 of the voltage detection lines L1, L3, L5, and L7 and three terminals provided on a lower side bite into the second substrate 32 from a lower surface and are electrically connected to the conductors 36 of the voltage detection lines L2, L4, and L6.

The connector 40 may be provided with terminals which bite into the conductors 36 of the voltage detection lines L1, L3, L5, and L7 and the conductors 36 of the voltage detection lines L2, L4, and L6 from inside the superposition of the connector connection portions 31c and 32c of the first substrate 31 and the second substrate 32.

Figure 5A:
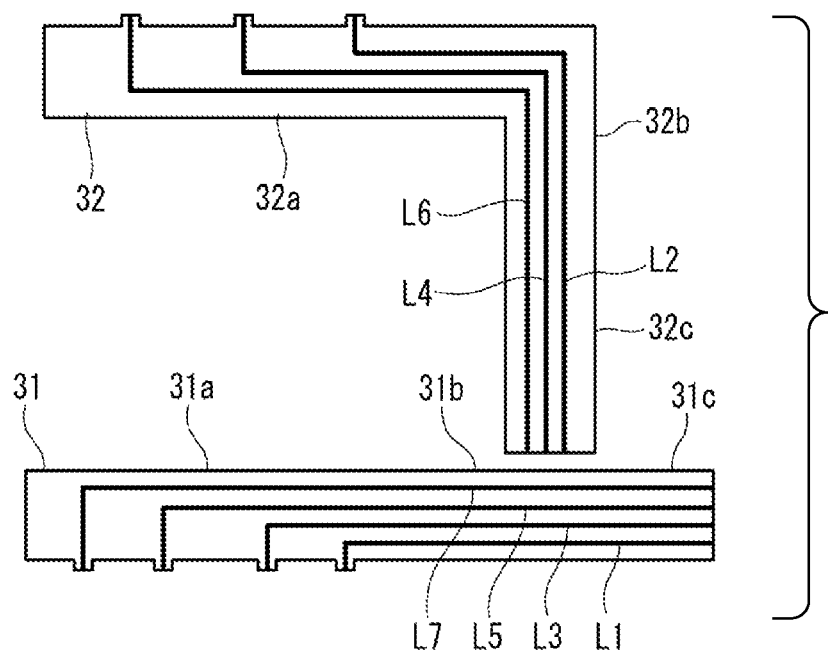
FIGS. 5A to 5C are views illustrating a manufacturing process of the battery module, where
Figure 5B:
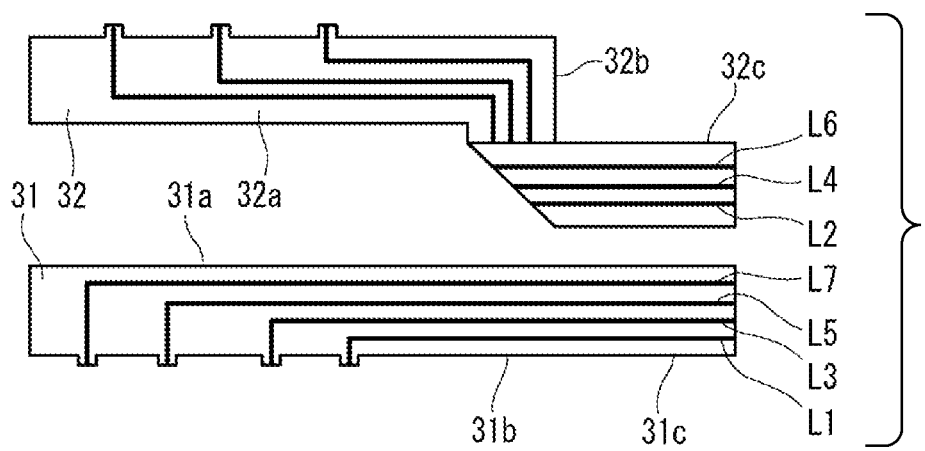
Figure 5C:
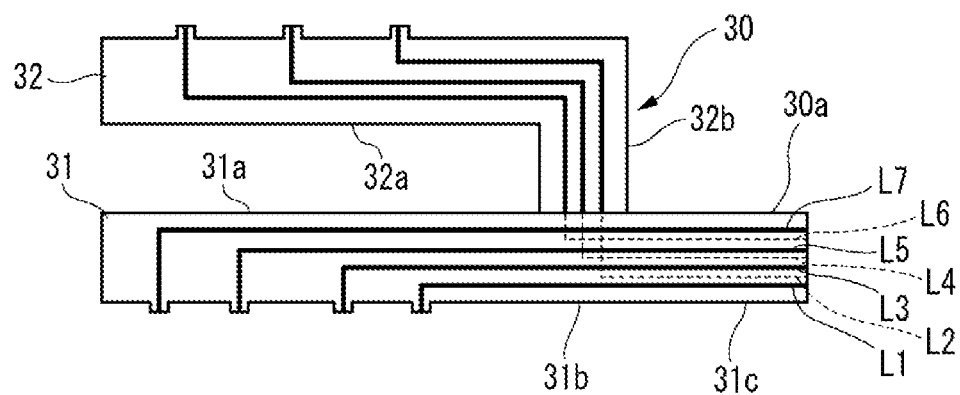

Next, a procedure for producing the battery module 10 described above will be described. FIGS. 5A to 5C are views illustrating a manufacturing process of the battery module, where FIGS. 5A to 5C are plan views of the first substrate and the second substrate, respectively.

As illustrated in FIG. 5A, the first substrate 31 and the second substrate 32 formed of flexible circuit boards are formed. In this case, the second substrate 32 is formed in an L shape in which each of the connection portion 32b and the connector connection portion 32c is linear.

As illustrated in FIG. 5B, the second substrate 32 is folded at a boundary between the connection portion 32b and the connector connection portion 32c and bent in a perpendicular direction to invert the connector connection portion 32c.

As illustrated in FIG. 5C, the connector connection portion 31c of the first substrate 31 and the connector connection portion 32c of the second substrate 32 are overlapped. As a result, the conductors 36 in the connector connection end 30a of the circuit body 30 are arranged in the order of the voltage detection lines L1 to L7 which are in the order of potential.

Then, the bus bars 20A and 20B are joined to the connection port portions 41 of the first substrate 31 and the second substrate 32 of the circuit body 30 and the connector 40 is attached to the connector connection end 30a.

In the battery module 10 manufactured in this manner, the bus bars 20A and 20B are fixed to the electrodes 3 of the battery cells 2 of the battery assembly 1 by being fastened by nuts and the connector 40 is joined to the ECU 5. Therefore, the ECU 5 detects the voltage of the battery cell 2 of the battery assembly 1 and monitors the voltage of each battery cell 2 to adjust the charge amount and the like.

As described above, according to the battery module 10 of the first embodiment, by folding a part of the second substrate 32 and overlapping it on the first substrate 31, in connector connection portions 31c and 32c, the other ends of the conductors 36, one ends of which are connected to respective bus bars 20A and 20B, are arranged in the order of voltage of the battery assembly. Therefore, in the connector 40 attached to the connector connection portions 31c and 32c, the terminals thereof are arranged in the order of voltage of the battery assembly 1. Therefore, when connecting the connector 40 to the ECU 5 which monitors the voltage of the battery cells 2 and adjusts the charge amount or the like, there is no need to provide a circuit or the like which rearranges the voltage detection lines L1 to L7 in the voltage order on the ECU 5. Thus, the circuit can be simplified.

Furthermore, the other ends of the conductors 36 can be arranged in the order of voltage of the battery assembly 1 in the connector connection portions 31c and 32c by folding a part of the second substrate 32 and overlapping it on the first substrate 31. That is, with a simple structure, the conductors 36 can be arranged in the order of voltage in the connector connection portions 31c and 32c.

Further, since the second substrate 32 is folded toward the first substrate 31, the width of the connector connection end 30a should be adapted to the width of the connector 40 regardless of the distance between the positive electrode 3A and the negative electrode 3B of the battery cells 2.

Second Embodiment

Next, a battery module according to a second embodiment will be described.

The same components as those of the first embodiment are given the same reference numerals and letters and the description thereof is omitted.

Figure 6:
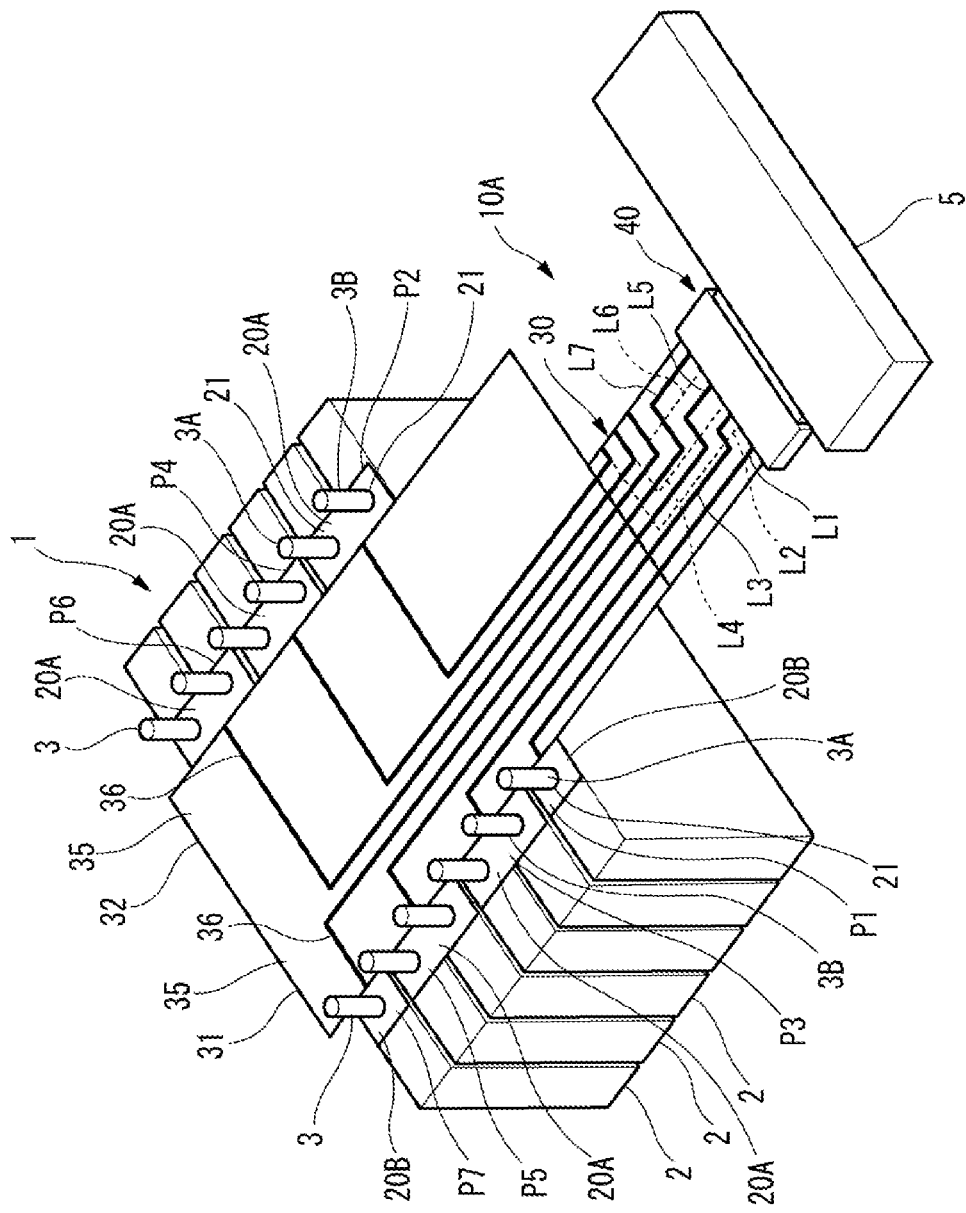
FIG. 6 is a perspective view of a battery assembly in which a battery module according to a second embodiment is assembled.
Figure 7:
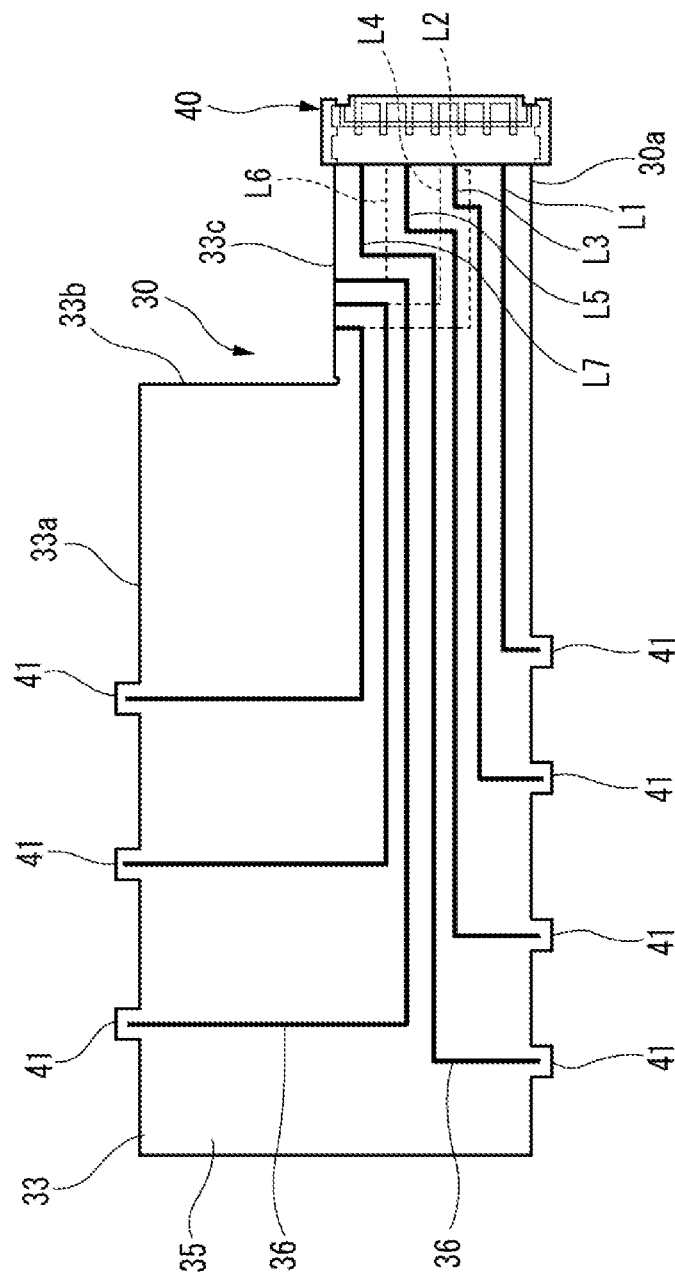
FIG. 7 is a plan view of a circuit body and a connector of the battery module.

FIG. 6 is a perspective view of a battery assembly in which a battery module according to the second embodiment is assembled. FIG. 7 is a plan view of a circuit body and a connector of the battery module.

As illustrated in FIGS. 6 and 7, in a battery module 10A according to the second embodiment, the circuit body 30 is formed of a single substrate 33. The substrate 33 is a flexible printed circuit (FPC) having a base 35 and a conductor 36.

The substrate 33 has a battery wiring portion 33a, a connection portion 33b, and a connector connection portion 33c. The battery wiring portion 33a and the connection portion 33b are formed to have substantially the same width and the connector connection portion 33c is formed to be narrower than the battery wiring portion 33a and the connection portion 33b. In the substrate 33, the battery wiring portion 33a is routed along the arrangement of the electrodes 3 at the top of the battery assembly 1.

The substrate 33 has connection port portions 41 connected to the bus bars 20A and 20B at both edges of the battery wiring portion 33a and one end of the conductor 36 is drawn into each connection port portion 41.

The conductors 36 of the substrate 33 are the voltage detection lines L1, L3, L5, and L7 connected to the detection points P1, P3, P5, and P7 and the voltage detection lines L2, L4, and L6 connected to the detection points P2, P4, and P6.

Figure 8:
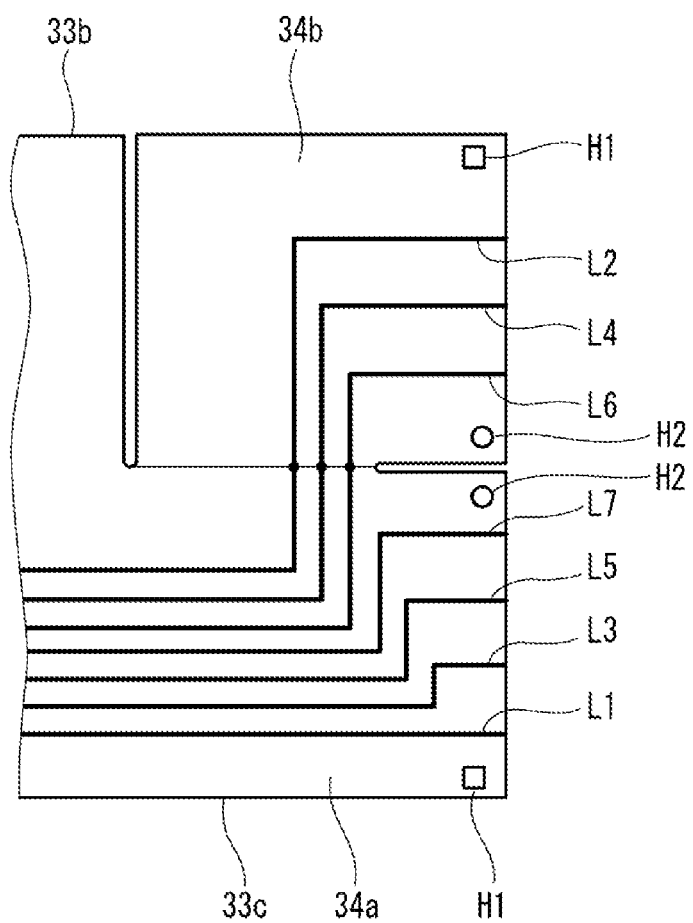
FIG. 8 is a plan view of a connector connection portion of a substrate constituting the circuit body.
Figure 9:
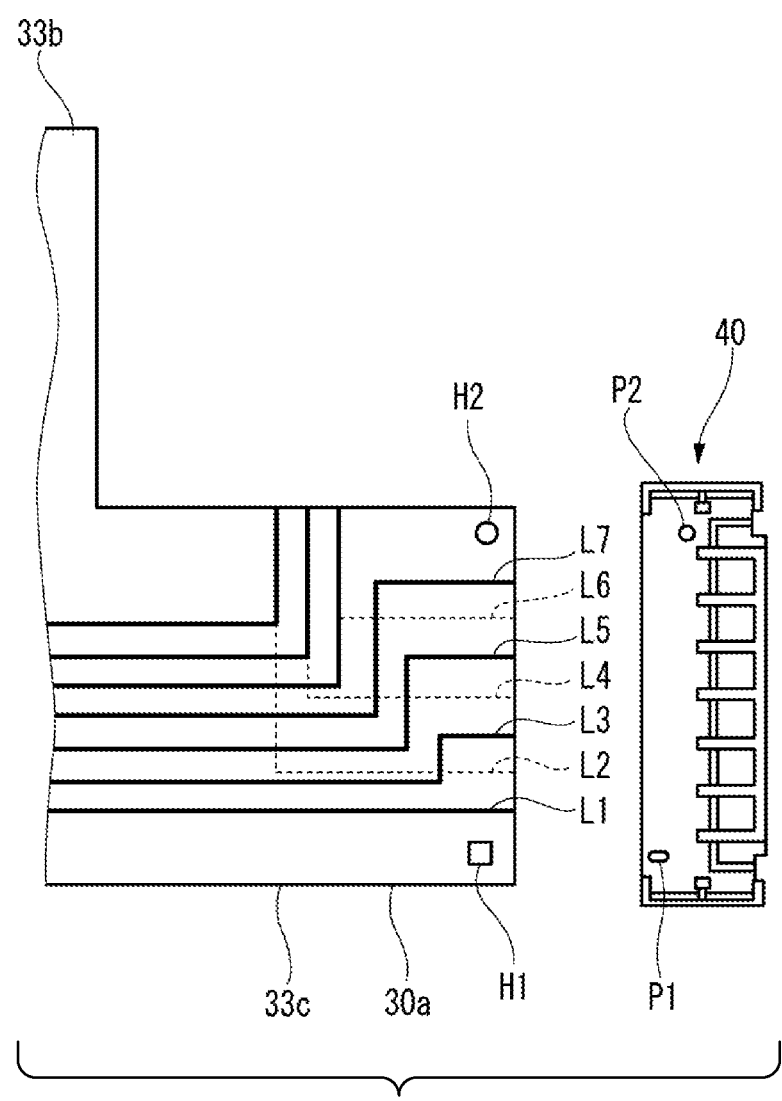
FIG. 9 is a plan view of the connector connection portion and the connector of the substrate constituting the circuit body.

FIG. 8 is a plan view of the connector connection portion of the substrate constituting the circuit body. FIG. 9 is a plan view of the connector connection portion and the connector of the substrate constituting the circuit body.

As illustrated in FIG. 8, the connector connection portion 33c of the substrate 33 has a base portion 34a and a folded portion 34b. Each of the base portion 34a and the folded portion 34b has a width dimension about half that of the connection portion 33b. The base portion 34a is connected to the connection portion 33b and the folded portion 34b is connected to a side edge portion of the base portion 34a. The voltage detection lines L1, L3, L5, and L7 of the conductors 36 are arranged in the base portion 34a and the voltage detection lines L2, L4, and L6 of the conductors 36 are drawn in and arranged in the folded portion 34b. As illustrated in FIG. 9, the folded portion 34b is folded and overlapped on the base portion 34a. Further, by folding the folded portion 34b and overlapping it on the base portion 34a, the voltage detection lines L2, L4, and L6 of the folded portion 34b are disposed between the voltage detection lines L1, L3, L5, and L7 of the base portion 34a. Thus, in the connector connection end 30a of the circuit body 30, the conductors 36 are arranged in the order of voltage detection lines L1 to L7 from one side. That is, in the connector connection end 30a, the conductors 36 are arranged in the order of voltage.

In addition, positioning holes H1 and H2 having a square hole shape and a round hole shape respectively are formed in the base portion 34a and the folded portion 34b and the positioning holes H1 and the positioning holes H2 respectively communicate by folding and overlapping the folded portion 34b on the base portion 34a.

The connector 40 connected to the connector connection end 30a has positioning pins P1 and P2 inserted into the positioning holes H1 and H2. The connector 40 is positioned with high accuracy relative to the connector connection end 30a by inserting the positioning pins P1 and P2 into the positioning holes H1 and H2 of the connector connection end 30a of the circuit body 30. As a result, the terminals of the connectors 40 are reliably electrically connected to the conductors 36 of the voltage detection lines L1 to L7 of the circuit body 30.

Figure 10A:
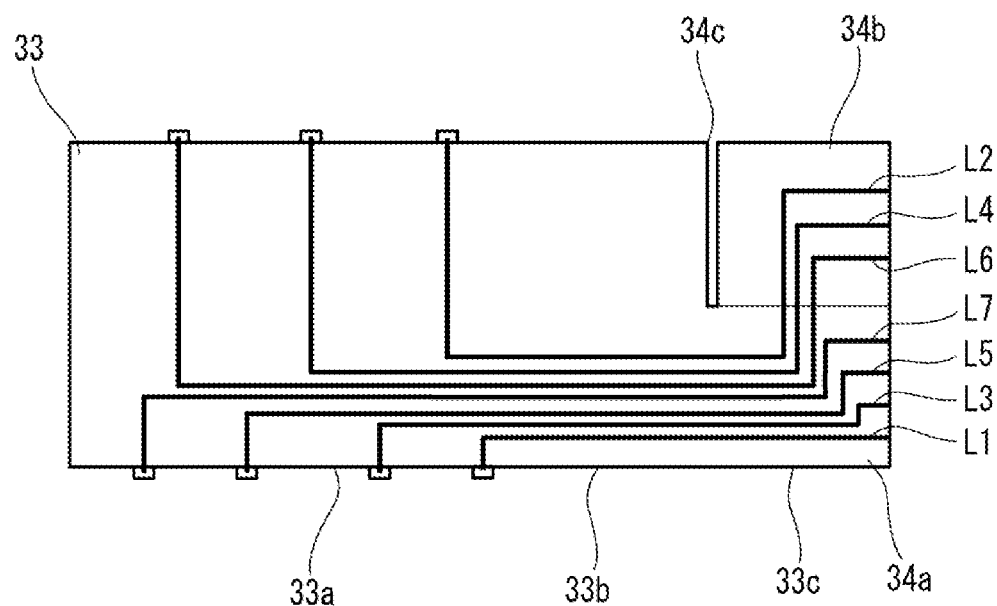
FIGS. 10A and 10B are views illustrating a manufacturing process of the battery module, where
Figure 10B:
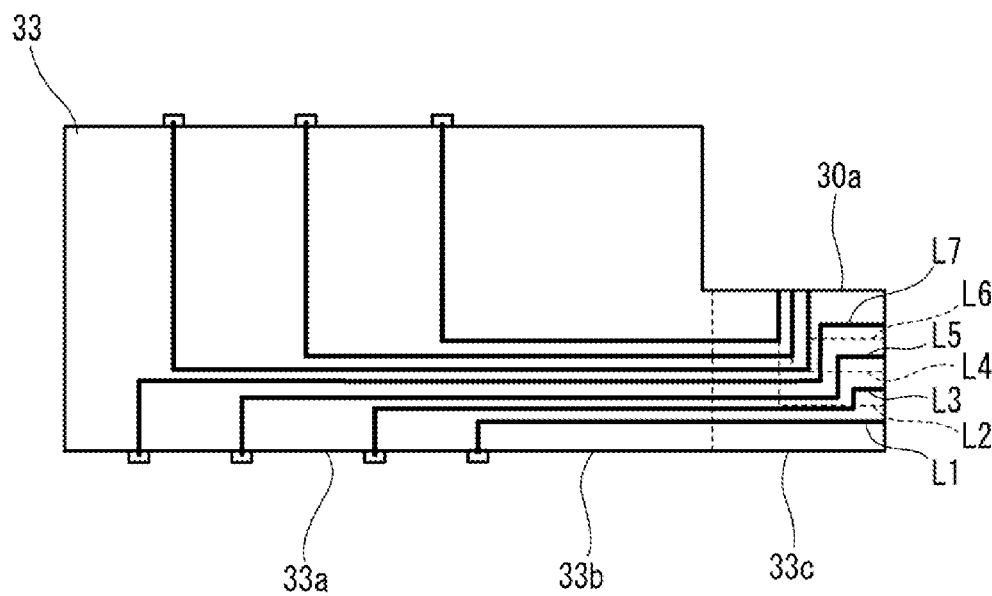

Next, a procedure for manufacturing the battery module 10A described above will be described. FIGS. 10A and 10B are views illustrating the manufacturing process of the battery module, where FIGS. 10A and 10B are plan views of the substrate, respectively.

As illustrated in FIG. 10A, the substrate 33 made of a flexible circuit substrate is formed. In this case, a folded portion 34b is formed by cutting away a part of the substrate 33 to form a slit portion 34c.

As illustrated in FIG. 10B, the folded portion 34b is folded and overlapped on the base portion 34a. As a result, the conductors 36 in the connector connection end 30a of the circuit body 30 are arranged in order of the voltage detection lines L1 to L7 which is in order of potential.

Then, the bus bars 20A and 20B are joined to the connection port portions 41 of the substrate 33 of the circuit body 30 and the connector 40 is attached to the connector connection end 30a.

In the battery module 10A manufactured in this manner, the bus bars 20A and 20B are fixed to the electrodes 3 of the respective battery cells 2 of the battery assembly 1 by being fastened by nuts and the connector 40 is joined to the ECU 5. Thereby, the ECU 5 detects the voltage of the battery cell 2 of the battery assembly 1 and monitors the voltage of each battery cell 2 to adjust the charge amount or the like.

As described above, according to the battery module 10A of the second embodiment, by folding and overlapping the folded portion 34b of the substrate 33 on the base portion 34a, the other ends of the conductors 36, one ends of which are connected to respective bus bars 20A and 20B, can be arranged in the voltage order of the battery assembly 1. That is, with the simplified structure, the conductors 36 can be arranged in the voltage order in the connector connection portion 33c.

The invention is not limited to the embodiments described above and appropriate modifications, improvements, or the likes are possible. In addition, the material, shape, size, number, arrangement location, and the like of each component in the embodiments described above are arbitrary and not limited as long as the invention can be achieved.

For example, in the embodiment described above, each battery cell 2 constituting the battery module 10 is not limited to a rectangular shape as illustrated in FIG. 1 and the like and may be a cylindrical shape. In this case, since the positive electrode and the negative electrode are arranged at both end portions in a cylinder axial direction of each battery cell 2, for example, the first substrate 31 and the second substrate 32 are routed along respective end portions.

In the embodiment described above, a case where the positive electrode 3A and the negative electrode 3B of the battery cell 2 are alternately arranged to be adjacent to each other in the battery module 10 is described as an example, but the invention is not limited thereto. The battery module 10 may be configured such that the positive electrodes 3A and the negative electrodes 3B of several adjacent battery cells 2 of a plurality of battery cells 2 are adjacent to each other, that is, several battery cells 2 are connected in parallel.

Here, the features of the circuit body and the battery module according to the embodiments of the invention described above will be briefly summarized and listed in the following [1] to [4].

[1] A circuit body (30) which is assembled to a battery assembly (1) in which electrodes (3) of a plurality of battery cells (2) are arranged in two rows and two or more electrodes (3) adjacent to each other in each row are connected by a conductive member (bus bar 20A, 20B), including:

a plurality of conductors (36) and a substrate (first substrate 31, second substrate 32, substrate 33) which has flexibility and is provided with the plurality of conductors (36), and wherein the substrate (first substrate 31, second substrate 32, substrate 33) includes a battery wiring portion (31a, 32a, 33a) which is routed along each row of the electrodes (3) and where one ends of the plurality of conductors (36) are respectively connected to the conductive members (bus bar 20A, 20B), and a connector connection portion (31c, 32c, 33c) where the other ends of the plurality of conductors (36) are connected to a connector, and a part of the substrate (first substrate 31, second substrate 32, substrate 33) is overlapped in the connector connection portion (31c, 32c, 33c), so an arrangement order of the other ends of the conductors (36) corresponds to the potential order of the conductive members (bus bar 20A, 20B) connected to the conductors (36).

[2] The circuit body according to [1], wherein
the substrate includes:
a first substrate (31) routed along one row of the electrodes (3); and
a second substrate (32) routed along the other row of the electrodes (3), and
a part of the second substrate (32) is folded in the connector connection portion (31c, 32c) and overlapped on the first substrate (31), so an arrangement order of the other ends of the conductors (36) included in the first substrate (31) and the second substrate (32) corresponds to the potential order of the conductive members (bus bar 20A, 20B) connected to the conductors (36).

[3] The circuit body according to [1], wherein
the substrate (33) includes a base portion (34a) and a folded portion (34b) folded with respect to the base portion (34a), and
the folded portion (34b) is folded in the connector connection portion (33c) and overlapped on the base portion (34a), so an arrangement order of the other ends of the conductors (36) included in the base portion (34a) and the folded portion (34b) corresponds to the potential order of the conductive members (bus bar 20A, 20B) connected to the conductors (36).

[4] A battery module (10, 10A), including:
the circuit body (30) according to [1];
a conductive member (bus bar 20A, 20B) connected to one end of a conductor (36) constituting the circuit body; and
a connector (40) connected to the other end of the conductor (36).

What is claimed is:

1. A circuit body which is assembled to a battery assembly by at least a first conductive member, a second conductive member, and a third conductive member, the battery assembly includes electrodes of a plurality of battery cells arranged in two rows, the first conductive member is connected to at least a first electrode of one row of the electrodes, the second conductive member is connected to at least one electrode of another row of the electrodes, and the third conductive member is connected to a second electrode of the one row of electrodes, the circuit body comprising:

a first conductor, a second conductor, a third conductor, a first substrate which has flexibility and is provided with the first conductor and the third conductor, and a second substrate that is separate from the first substrate, the second substrate has flexibility and is provided with the second conductor the first substrate includes
a first battery wiring portion which is routed along the one row of the electrodes and where one end of each of the first conductor and the third conductor is connected to first and third conductive members of the plurality of conductive members, and
a first connector connection portion where other ends of the first conductor and the third conductor are connected to a connector, the second substrate includes
a second battery wiring portion which is routed along the other row of the electrodes and where one end of the second conductor is connected to the second conductive member, and
a second connector connection portion where another end of the second conductor is connected to the connector, a part of the second substrate is folded in the second connector connection portion and overlapped on the first substrate and the other end of the second conductor is arranged between the other ends of the first conductor and the third conductor, so an arrangement order of the other ends of the first and third conductors included in the first substrate and the second conductor included with the second substrate corresponds to the potential order of the first, second and third conductive members.

2. A battery module assembled to a battery assembly in which electrodes of a plurality of battery cells are arranged in two rows, comprising:

a circuit body including a first conductor, a second conductor, a third conductor, and a substrate;
a first conductive member connected to one end of the first conductor, a second conductive member connected to one end of the second conductor, a third conductive member connected to one end of the third conductor; and
a connector connected to another end of each of the first conductor, the second conductor, and the third conductor, wherein the first conductive member is connected to a first electrode of one row of the electrodes, the second conductive member is connected to at least one electrode of another row of the electrodes, the third conductive member is connected to a second electrode of the one row of the electrodes, the substrate has flexibility and is provided with the first, second, and third conductors, and the substrate includes
a base portion which is routed along each row of the electrodes and where the one ends of the first, second, and third conductors are respectively connected to the first, second, and third conductive members, and
a folded portion that is folded with respect to the base portion, the second conductor extends from the base portion onto the folded portion, and the folded portion is provided with the other end of the second conductor, and the folded portion is overlapped on the base portion and the other end of the second conductor is arranged between the other ends of the first and third conductors, so an arrangement order of the other ends of the first, second, and third conductors corresponds to the potential order of the first, second, and third conductive members.

\* \* \* \* \*